US010566958B1

(12) United States Patent
Song et al.

(10) Patent No.: US 10,566,958 B1
(45) Date of Patent: Feb. 18, 2020

(54) CLOCK DISTRIBUTION SCHEMES UTILIZING INJECTION LOCKED OSCILLATION

(71) Applicant: NVIDIA Corp., Santa Clara, CA (US)

(72) Inventors: Sanquan Song, Mountain View, CA (US); Olakanmi Oluwole, Mountain View, CA (US); John Poulton, Chapel Hill, NC (US); Carl Thomas Gray, Apex, NC (US)

(73) Assignee: NVIDIA Corp., Santa Clara, CA (US)

( * ) Notice: Subject to any disclaimer, the term of this patent is extended or adjusted under 35 U.S.C. 154(b) by 0 days.

(21) Appl. No.: 16/248,558

(22) Filed: Jan. 15, 2019

(51) Int. Cl.
| H03L 7/099 | (2006.01) |
| H03B 27/00 | (2006.01) |
| H03B 1/04 | (2006.01) |
| H03K 3/012 | (2006.01) |
| G06F 1/06 | (2006.01) |
| G06F 1/10 | (2006.01) |
| H03K 3/03 | (2006.01) |

(52) U.S. Cl.
CPC .............. *H03K 3/012* (2013.01); *G06F 1/06* (2013.01); *G06F 1/10* (2013.01); *H03K 3/0315* (2013.01)

(58) Field of Classification Search
CPC combination set(s) only.
See application file for complete search history.

(56) References Cited

U.S. PATENT DOCUMENTS

| 7,612,621 | B2 * | 11/2009 | Kim | H03K 5/13 |
| | | | | 327/156 |
| 8,217,725 | B2 * | 7/2012 | Kondou | H03K 3/0315 |
| | | | | 331/45 |
| 8,749,289 | B2 * | 6/2014 | Li | G06F 1/06 |
| | | | | 327/291 |
| 8,981,822 | B2 * | 3/2015 | Li | H03K 23/68 |
| | | | | 327/117 |
| 9,019,021 | B2 * | 4/2015 | Banin | H03K 3/0315 |
| | | | | 331/57 |
| 9,306,577 | B2 * | 4/2016 | Huang | H03L 1/00 |
| 9,473,129 | B2 * | 10/2016 | Luo | H03K 5/131 |
| 9,755,574 | B2 * | 9/2017 | Chatwin | H03K 3/0315 |
| 10,014,868 | B1 * | 7/2018 | Raj | H03L 7/24 |
| 2004/0032300 | A1 * | 2/2004 | Joordens | H03K 3/0315 |
| | | | | 331/57 |
| 2007/0090867 | A1 * | 4/2007 | Kim | G06F 1/04 |
| | | | | 327/291 |
| 2007/0241826 | A1 * | 10/2007 | Ueno | H03B 27/00 |
| | | | | 331/57 |

* cited by examiner

*Primary Examiner* — An T Luu
(74) *Attorney, Agent, or Firm* — Rowan TELS LLC

(57) ABSTRACT

Injection locked oscillation circuits are applied along clock distribution circuit paths to increase clock signal bandwidth, reduce duty cycle error, reduce quadrature phase error, reduce clock signal jitter, and reduce clock signal power consumption.

19 Claims, 7 Drawing Sheets

CLOCK DISTRIBUTION SCHEMES UTILIZING INJECTION LOCKED OSCILLATION

BACKGROUND

In system-on-a-chip (SOC) applications clock distribution is utilized to spread the high-speed clock from the clock generator circuit to the various functional blocks of the SOC. In addition to high power consumption there are additional problems with conventional clock distribution schemes including:
1. Duty cycle error (DCE) amplification;
2. Quadrature phase error (IQE) accumulation; and
3. Clock signal jitter accumulation including of supply induced jitter and device noise induced jitter.

To reduce duty cycle error and quadrature phase error problems a lower clock signal fan-out may be used at the cost of more stages, more power consumption, and more clock signal jitter.

A conventional clock distribution circuit 100 is illustrated in FIG. 1. To minimize signal propagation delay a clock signal fan-out number of four (FO4) may be utilized. Cross-coupled inverter pairs 102 are utilized along the clock distribution circuit to maintain the differential nature of the clocks. As the clock frequency increases the bandwidth of the FO4 clock distribution scheme with cross-coupled inverter pairs becomes insufficient leading to increased duty cycle error or even missing clock edges (clock failure) at the circuits driven by the clock. To maintain bandwidth the fan-out number may be reduced and the number of clock distribution stages increased resulting in higher power consumption, increased clock signal propagation delay, and higher clock signal jitter.

BRIEF SUMMARY

Disclosed herein are embodiments of injection locked oscillation (ILO) circuits applied along clock distribution circuit paths to extend bandwidth, reduce duty cycle error, reduce quadrature phase error, reduce clock signal jitter, and reduce clock signal power consumption.

BRIEF DESCRIPTION OF THE SEVERAL VIEWS OF THE DRAWINGS

To easily identify the discussion of any particular element or act, the most significant digit or digits in a reference number refer to the figure number in which that element is first introduced.

DETAILED DESCRIPTION

Figure 1:
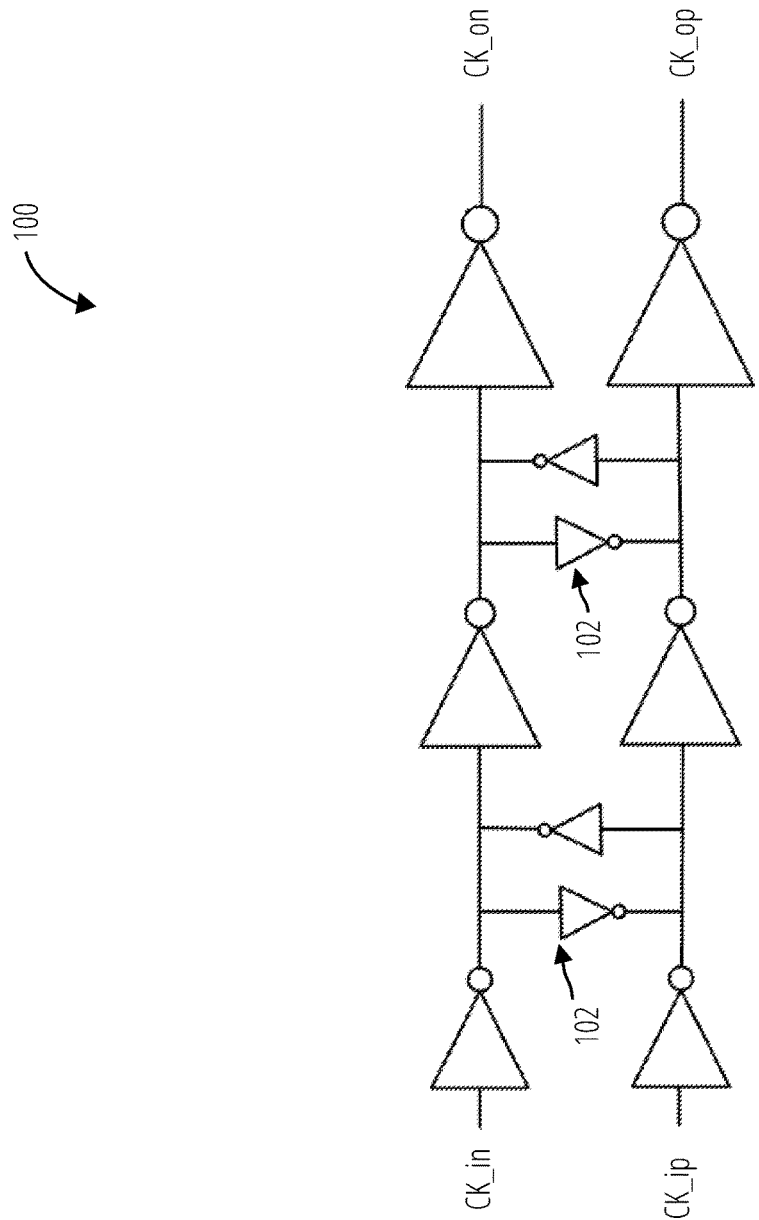
FIG. 1 illustrates a conventional clock distribution circuit 100 in accordance with one embodiment.

Disclosed herein are embodiments of clock distribution circuits that apply injection locked oscillation along clock distribution circuits to reduce duty cycle error. The clock distribution circuits generally comprise multiple individual clock signal paths divided into a plurality of stages isolated from one another by inverters. Intertwining injection locked oscillation feedback circuit paths are added to these paths, creating feedback signals that traverse at least one cross-coupled inverter pair disposed between the isolation inverters. The term "intertwining" is used herein to mean that the feedback circuit paths each traverse multiple ones of the individual clock signal paths in the clock distribution circuit.

In the Drawings certain circuit elements well known in the art (e.g., certain inverters) are not numbered or labeled for simplicity. Certain circuit elements may have different sizes indicating larger surface area in fabrication, for example to handle different power, frequency, or other operational conditions. However, the size of an element should not be construed as limiting or necessary unless specifically indicated in the description.

Figure 2:
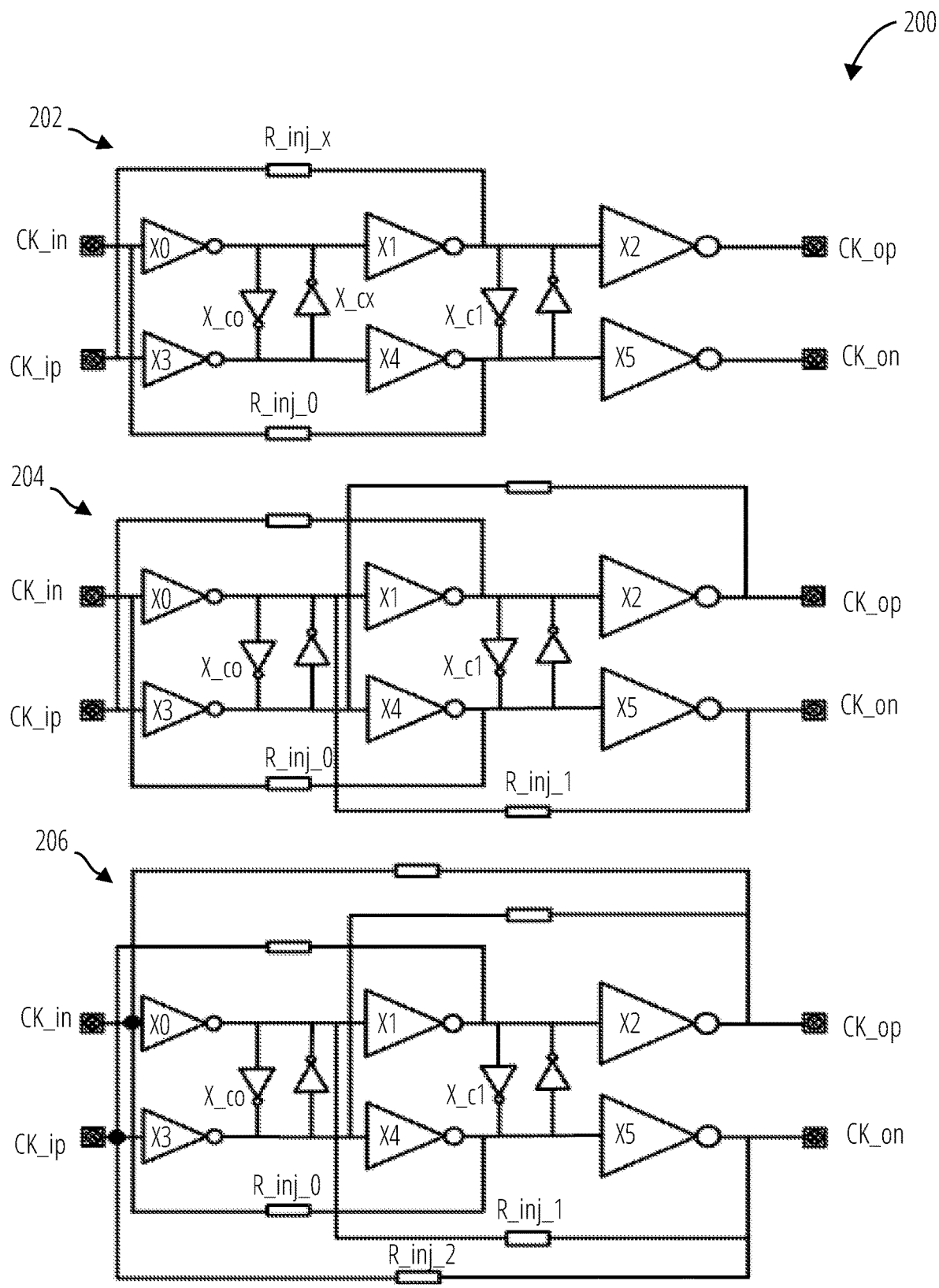
FIG. 2 illustrates injection locked oscillation circuit embodiments 200 in accordance with one embodiment.

Referring to the injection locked oscillation circuit embodiments 200 of FIG. 2, a circuit 202 utilizes R_inj_0 to form a feedback circuit path through inverters X0→X_c0→X4. In the circuit 202 the open loop phase shift is 180° for direct current forming a negative feedback loop and reducing the direct current gain factor. Near the circuit resonant frequency the open loop phase shift is 360° and a positive feedback loop is formed increasing the alternating current gain factor. The duty cycle error is a direct current component and therefore the duty cycle error is filtered out to some extent. A similar feedback circuit path X3→X_cx→X1 is symmetrically formed using R_inj_x.

In circuit 204 an additional feedback circuit path is added by R_inj_1 to further improve the duty cycle correction signal gain. The feedback circuit paths X0→X_c0→X4 and X1-X_c1→X5 intertwine to further reduce the direct current gain factor and increase the alternating current gain factor near the circuit resonant frequency, enhancing the duty cycle correction signal. As with circuit 204 these feedback circuit paths are symmetrically applied.

In circuit 206 a third feedback circuit path is symmetrically added via R_inj_2 to still further reduce the direct current gain factor and increase the alternating current gain factor around the circuit resonant frequency.

Thus when differential clock distribution is utilized the feedback circuit paths may one, two, three, or more pairs of symmetrical feedback circuit paths from one or more subsequent stage of the clock distribution circuit to inputs of one or more preceding stages of the clock distribution circuit.

The injection locked oscillation circuit embodiments 200 may provide substantial improvement in clock jitter at typical-typical (TT), fast-fast (FF), and slow-slow (SS) process corners while maintaining the clock signal at close to power rail-to-rail amplitudes. The noise-induced clock signal jitter at the SS process corner particularly at higher operating temperatures may also be reduced.

Figure 3:
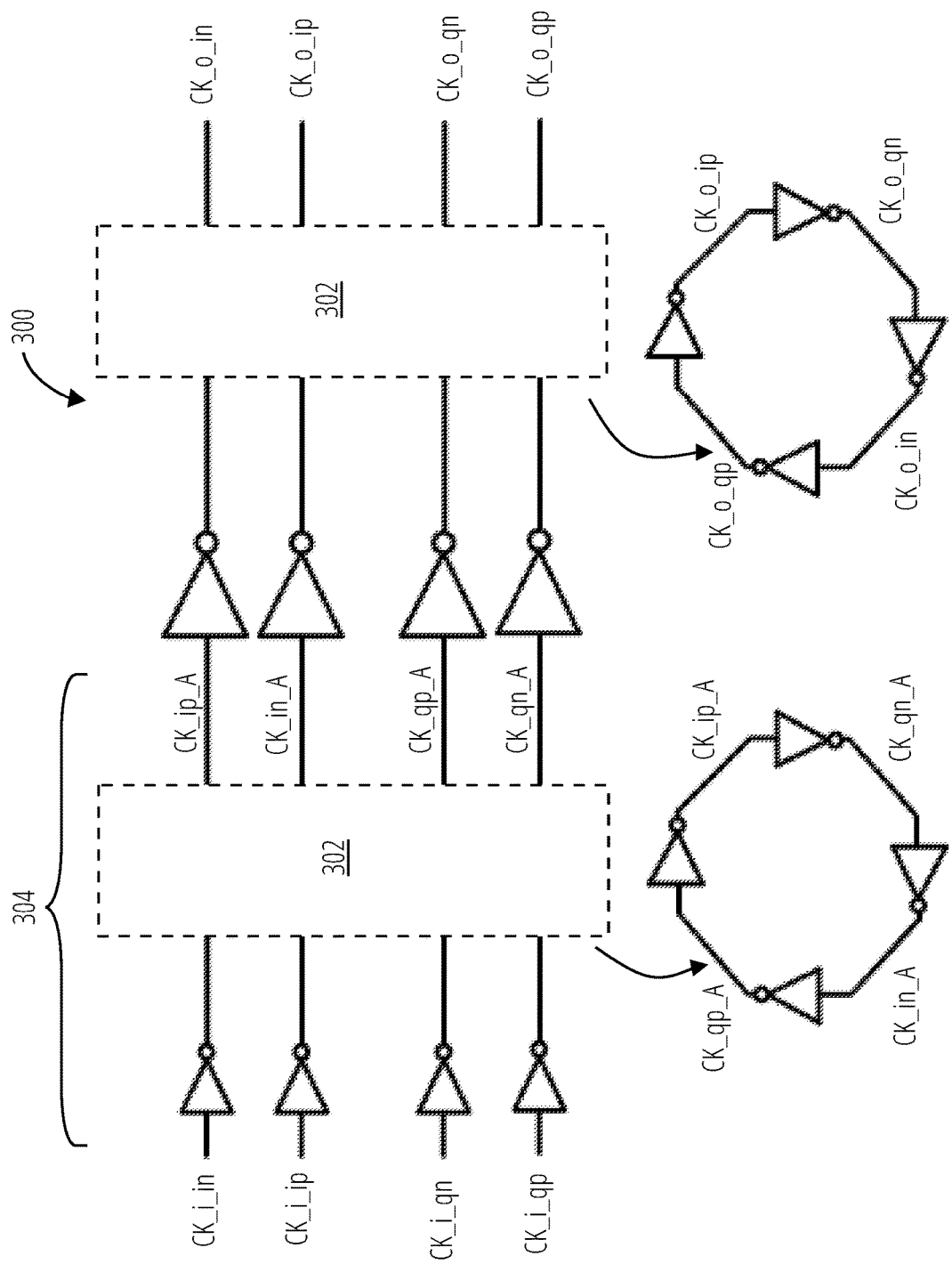
FIG. 3 illustrates a quadrature clock distribution circuit 300 in accordance with one embodiment.
Figure 4:
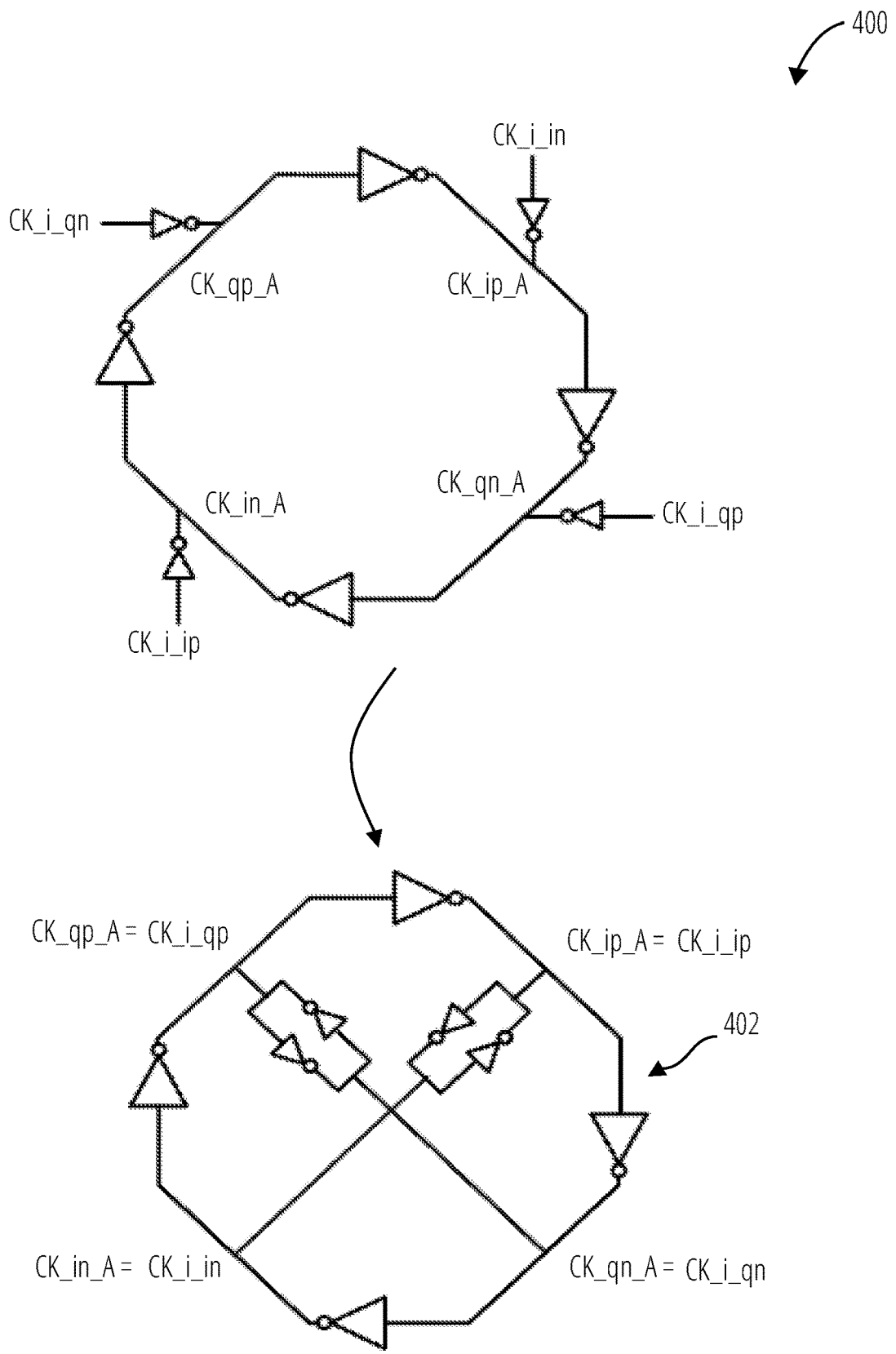
FIG. 4 illustrates a circuit analogy 400 in accordance with one embodiment.

FIG. 3 illustrates a quadrature clock distribution circuit 300 in one embodiment. Inverter ring circuits 302 are utilized along the clock distribution circuit to reduce the quadrature phase error. With the inverter ring circuits 302 applied and when the input clock frequency is close to the circuit resonant frequency the first circuit stage 304 operates like an oscillator circuit 402, as shown in one embodiment by the circuit analogy 400 of FIG. 4. The quadrature clock distribution circuit 300 may also reduce duty cycle error as well.

In the quadrature clock distribution circuit 300 the feedback circuit paths traverse the inverter ring circuits 302 disposed between the isolation inverters defining the stages of the of the quadrature clock distribution circuit 300. The inverter ring circuits 302 each comprise four back-to-back inverters, meaning the output of one inverter is utilized as an input to the next inverter along the cross-coupled ring circuit. Each inverter ring circuits 302 operates as an injection locked oscillator at a circuit resonant frequency of the quadrature clock distribution circuit 300.

Figure 5:
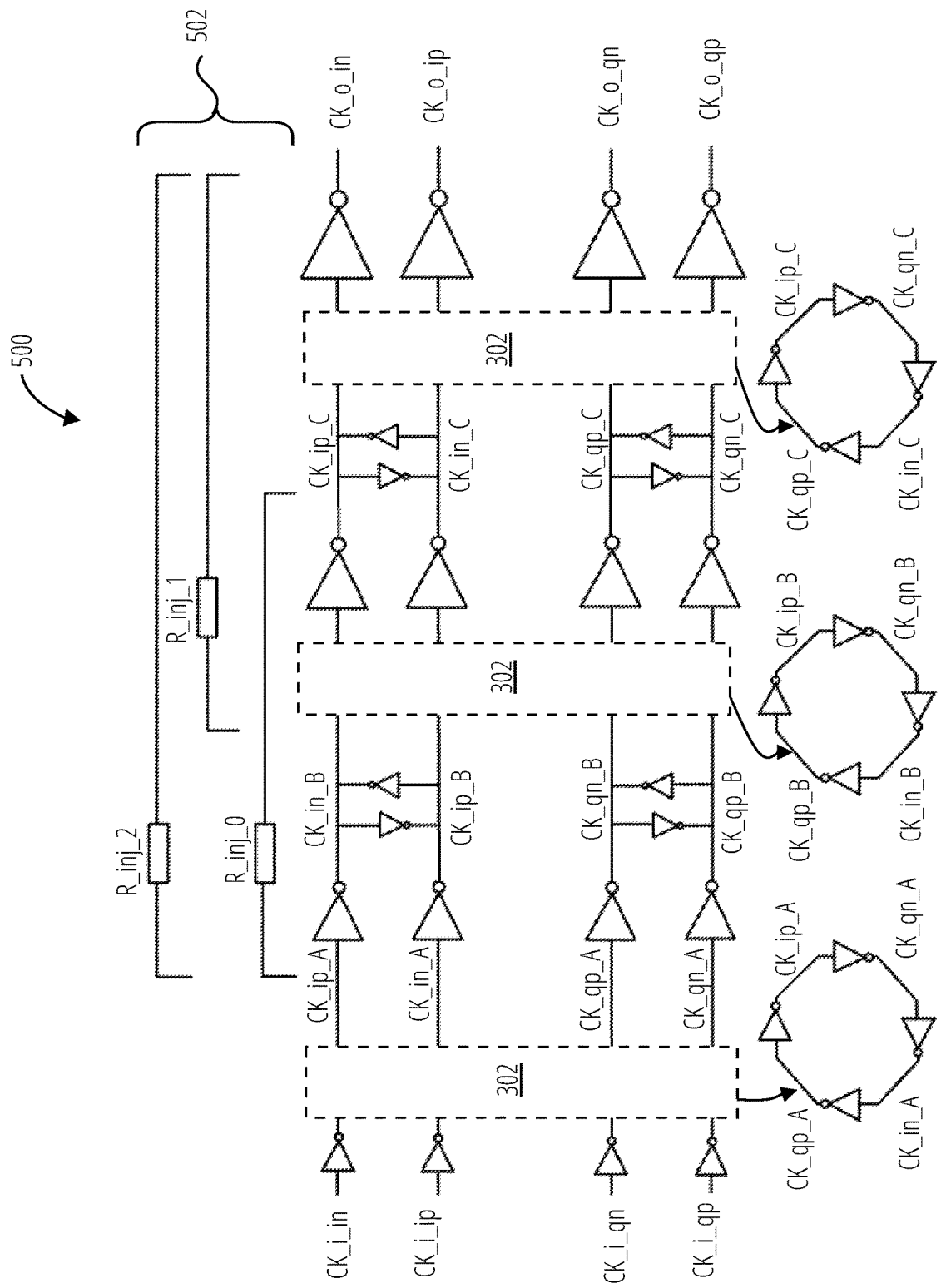
FIG. 5 illustrates a clock distribution scheme 500 in accordance with one embodiment.

The quadrature clock distribution circuit 300 may be combined with differential clock distribution techniques to implement a hybrid clock distribution scheme as illustrated by the clock distribution scheme 500 of FIG. 5. Three four-stage inverter ring circuits 302 are utilized to reduce quadrature phase error. Three feedback circuit paths 502 are also utilized to improve the clock distribution circuit bandwidth, reduce the duty cycle error, and reduce the clock signal jitter.

The inverter ring circuits 302 may in some embodiments be fine-tuned (e.g., by adjusting inverter sizes, adding impedances, etc.) at process corners to more precisely match their oscillation frequency to the clock frequency for improved performance. The inverter ring circuits 302 not only reduce quadrature phase error but also increase the clock distribution circuit bandwidth for example at SS process corners.

The disclosed clock distribution schemes may be applied to differential clock distribution in which the stages are so widely separated that the feedback circuit paths create problems with routing and parasitic capacitance.

Figure 6:
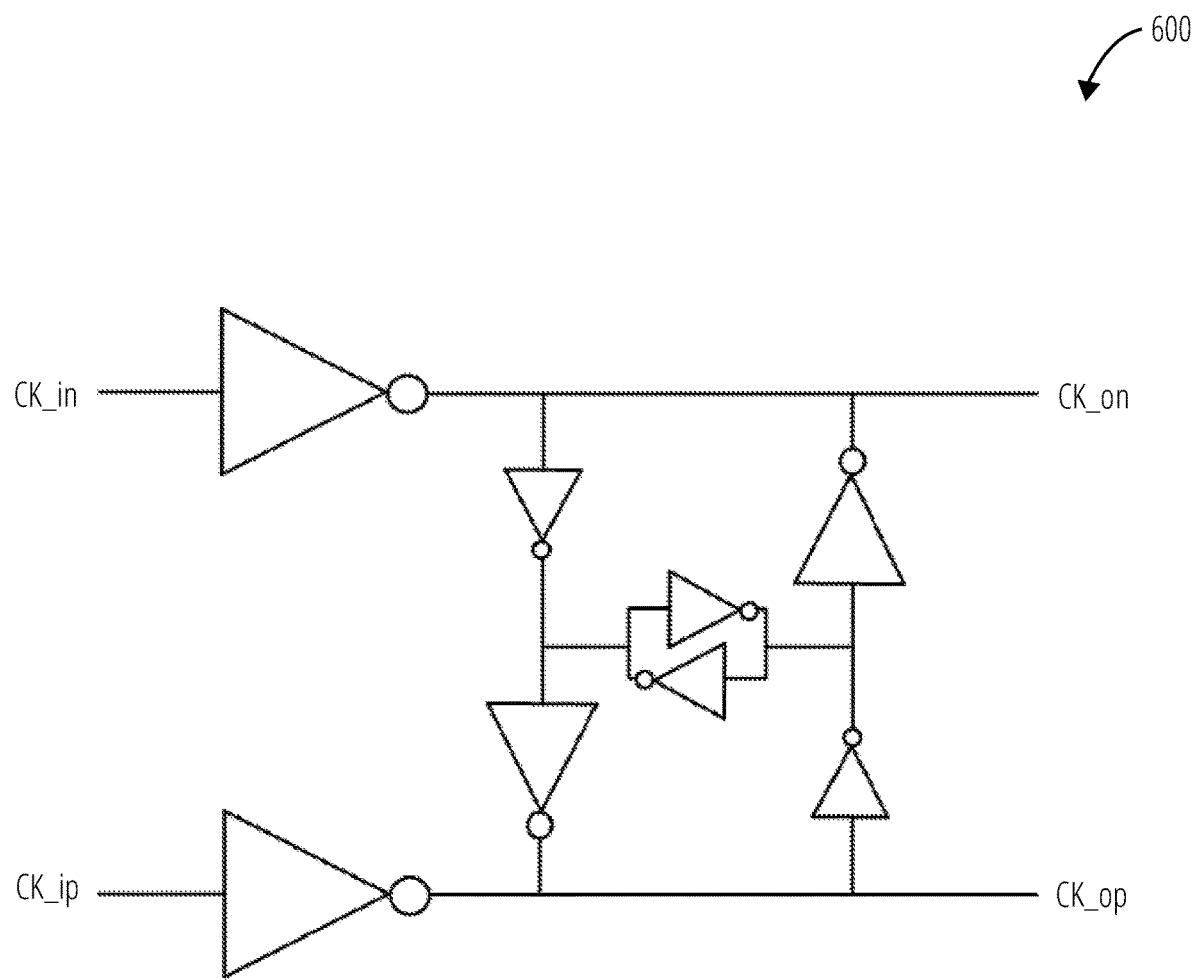
FIG. 6 illustrates a duty cycle error correction circuit 600 in accordance with one embodiment.

FIG. 6 illustrates a duty cycle error correction circuit 600 in which the clock signal input to a stage of the clock distribution circuit does not contribute to injection locked oscillation.

Figure 7:
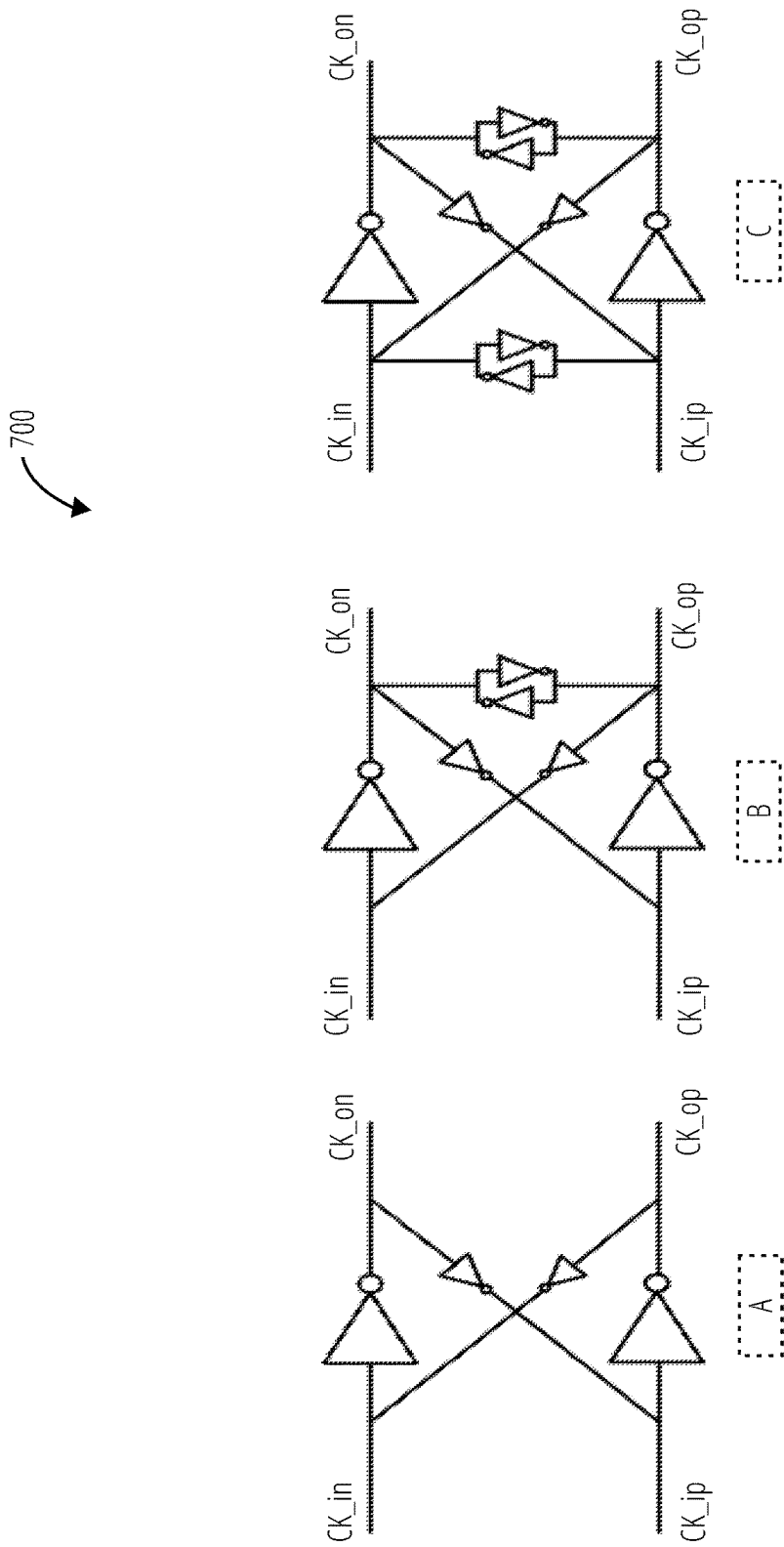
FIG. 7 illustrates duty cycle error correction circuit embodiments 700 in accordance with one embodiment.

FIG. 7 illustrates duty cycle error correction circuit embodiments 700 (A, B, and C) in which the clock signal input to the clock distribution circuit stages contributes to injection locked oscillation. In view of FIG. 7, those of skill in the art will recognize that the circuit may be operated near the circuit resonant frequency to reduce duty cycle error.

Various embodiments have been illustrated and others will now be apparent to those of ordinary skill in the art. It will be understood that the illustration examples do not represent the only possible embodiments and that the scope of invention is described by the following claims.

What is claimed is:

1. A clock distribution circuit comprising:
   a plurality of stages isolated from one another by a plurality of inverters; and
   a plurality of intertwining injection locked oscillation feedback circuit paths traversing at least one cross-coupled inverter pair between the inverters;
   wherein the clock distribution circuit is a hybrid quadrature clock distribution circuit and differential clock distribution circuit, and the feedback circuit paths comprise both of (a) at least one pair of symmetrical feedback circuit paths from at least one subsequent stage of the clock distribution circuit to an input of one or more preceding stages of the clock distribution circuit, and (b) feedback circuit paths traversing a cross-coupled ring circuit disposed between the inverters.

2. The clock distribution circuit of claim 1, the feedback circuit paths further comprising two pairs of symmetrical intertwining feedback circuit paths from the at least one subsequent stage of the clock distribution circuit to the inputs of the one or more preceding stages of the clock distribution circuit.

3. The clock distribution circuit of claim 1, the feedback circuit paths comprising three pairs of symmetrical intertwining feedback circuit paths from the at least one subsequent stage of the clock distribution circuit to inputs of the one or more preceding stages of the clock distribution circuit.

4. The clock distribution circuit of claim 1, further comprising a cross-coupled ring circuit comprising four back-to-back inverters.

5. The clock distribution circuit of claim 4, the cross-coupled ring circuit operating as an injection locked oscillator at a circuit resonant frequency of the clock distribution circuit.

6. A quadrature clock distribution circuit comprising:
   a plurality of intertwining injection locked oscillation feedback circuit paths traversing at least one cross-coupled inverter pair between a plurality of inverters; and
   the feedback circuit paths traverse a cross-coupled ring circuit disposed between the inverters and comprise at least one pair of symmetrical feedback circuit paths from at least one subsequent stage of the quadrature clock distribution circuit to inputs of one or more preceding stages of the quadrature clock distribution circuit.

7. The quadrature clock distribution circuit of claim 6, the feedback circuit paths further comprising two pairs of symmetrical intertwining feedback circuit paths.

8. The quadrature clock distribution circuit of claim 6, the feedback circuit paths comprising three pairs of symmetrical intertwining feedback circuit paths.

9. The quadrature clock distribution circuit of claim 6, further comprising a cross-coupled ring circuit comprising four back-to-back inverters.

10. The quadrature clock distribution circuit of claim 9, the cross-coupled ring circuit operating as an injection locked oscillator at a circuit resonant frequency of the quadrature clock distribution circuit.

11. The quadrature clock distribution circuit of claim 6, further comprising a differential clock distribution circuit, and the feedback circuit paths further comprise feedback circuit paths traversing a cross-coupled ring circuit disposed between the inverters.

12. A quadrature clock distribution circuit comprising:
   a plurality of intertwining injection locked oscillation feedback circuit paths traversing at least one cross-coupled inverter pair between a plurality of inverters, wherein the feedback circuit paths comprise at least one pair of symmetrical feedback circuit paths from at least one subsequent stage of the quadrature clock distribution circuit to inputs of one or more preceding stages of the quadrature clock distribution circuit; and
   the feedback circuit paths traverse a cross-coupled ring circuit disposed between the inverters and the feedback circuit paths comprise two pairs of symmetrical intertwining feedback circuit paths.

13. The quadrature clock distribution circuit of claim 12, the feedback circuit paths further comprising at least one pair of symmetrical feedback circuit paths from at least one subsequent stage of the quadrature clock distribution circuit to inputs of one or more preceding stages of the quadrature clock distribution circuit.

14. The quadrature clock distribution circuit of claim 12, the feedback circuit paths comprising three pairs of symmetrical intertwining feedback circuit paths.

15. The quadrature clock distribution circuit of claim 12, further comprising a cross-coupled ring circuit comprising four back-to-back inverters.

16. The quadrature clock distribution circuit of claim 15, the cross-coupled ring circuit operating as an injection locked oscillator at a circuit resonant frequency of the quadrature clock distribution circuit.

17. A quadrature clock distribution circuit comprising:
a plurality of intertwining injection locked oscillation feedback circuit paths traversing at least one cross-coupled inverter pair between a plurality of inverters, wherein the feedback circuit paths comprise at least one pair of symmetrical feedback circuit paths from at least one subsequent stage of the quadrature clock distribution circuit to inputs of one or more preceding stages of the quadrature clock distribution circuit; and
the feedback circuit paths traverse a cross-coupled ring circuit disposed between the inverters and the feedback circuit paths comprise three pairs of symmetrical intertwining feedback circuit paths.

18. The quadrature clock distribution circuit of claim 17, further comprising a differential clock distribution circuit, and the feedback circuit paths further comprise feedback circuit paths traversing a cross-coupled ring circuit disposed between the inverters.

19. A quadrature clock distribution circuit comprising:
a differential clock distribution circuit;
a plurality of intertwining injection locked oscillation feedback circuit paths traversing at least one cross-coupled inverter pair between a plurality of inverters, and the feedback circuit paths comprise both of (a) at least one pair of symmetrical feedback circuit paths from at least one subsequent stage to an input of one or more preceding stages, and (b)
the feedback circuit paths traverse a cross-coupled ring circuit disposed between the inverters.

* * * * *